(12) United States Patent
Lee

(10) Patent No.: US 12,707,573 B2
(45) Date of Patent: Aug. 11, 2026

(54) FOLDABLE DISPLAY DEVICE WITH SUPPORT PLATE

(71) Applicant: SAMSUNG DISPLAY CO., LTD., Yongin-si (KR)

(72) Inventor: Jung Il Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 105 days.

(21) Appl. No.: 18/652,175

(22) Filed: May 1, 2024

(65) Prior Publication Data

US 2025/0107013 A1 Mar. 27, 2025

(30) Foreign Application Priority Data

Sep. 25, 2023 (KR) ........................ 10-2023-0128614

(51) Int. Cl.
*H05K 5/00* (2025.01)
*H05K 5/02* (2006.01)

(52) U.S. Cl.
CPC .................................... *H05K 5/02* (2013.01)

(58) Field of Classification Search
CPC ....... H05K 5/02; G06F 1/1616; G06F 1/1641; G06F 1/1686; G06F 1/1652; G06F 1/1618; G09F 9/301; H10K 77/111; H10K 59/65; H10K 59/87
See application file for complete search history.

(56) References Cited

U.S. PATENT DOCUMENTS

| | | | | |
|---|---|---|---|---|
| 9,811,120 | B2 * | 11/2017 | Namkung | G02F 1/133305 |
| 9,829,923 | B2 * | 11/2017 | Lee | G06F 1/1652 |
| 10,043,421 | B2 * | 8/2018 | Koo | G09F 9/301 |
| 10,429,894 | B2 * | 10/2019 | Xia | G06F 1/1641 |
| 10,542,128 | B2 * | 1/2020 | Kang | H04M 1/02 |
| 10,645,205 | B2 * | 5/2020 | Lee | H04M 1/0216 |
| 10,659,576 | B1 * | 5/2020 | Hsu | G06F 1/1624 |
| 10,909,889 | B2 * | 2/2021 | Lee | G09F 9/301 |
| 11,076,494 | B2 * | 7/2021 | Feng | G09F 9/301 |
| 11,334,117 | B2 * | 5/2022 | Youn | H10K 77/111 |
| 11,455,916 | B2 * | 9/2022 | Lee | G09F 9/301 |
| 11,567,532 | B2 * | 1/2023 | Jung | G09G 3/035 |

(Continued)

FOREIGN PATENT DOCUMENTS

| | | | |
|---|---|---|---|
| CN | 114387875 | A | 4/2022 |
| KR | 10-2020-0064376 | A | 6/2020 |

(Continued)

*Primary Examiner* — Rockshana D Chowdhury
(74) *Attorney, Agent, or Firm* — F. CHAU & ASSOCIATES, LLC

(57) ABSTRACT

A display device includes a first plate, a second plate disposed on the first plate, and a display module disposed on the second plate. The display module includes a first non-folding area, a second non-folding area, a first folding area disposed between the first non-folding area and the second non-folding area, and a second folding area disposed between the first non-folding area and the second non-folding area. The first folding area is configured to fold so as to bring the first non-folding area and the second non-folding area to face one another in a first use form. The second folding area is configured to fold so as to bring the first non-folding area and the second non-folding area to face away one another in a second use form.

20 Claims, 9 Drawing Sheets

(56) References Cited

U.S. PATENT DOCUMENTS 11,747,861 B2* 9/2023 Zhang .................. G06F 1/1652 361/679.27
11,832,406 B2* 11/2023 Kim ...................... G06F 1/1652
11,899,507 B2* 2/2024 Lee ....................... G06F 1/1652
12,034,879 B1* 7/2024 Kushwaha .......... H04M 1/0268
12,164,333 B2* 12/2024 Wang .................... G06F 1/1641
12,277,013 B2* 4/2025 Lee ...................... G09G 3/3266
2012/0264489 A1* 10/2012 Choi ................... H04M 1/0247 455/566
2014/0004906 A1* 1/2014 Chi ......................... G06F 3/016 455/566
2014/0285476 A1* 9/2014 Cho .................... H04M 1/0247 345/204
2016/0324023 A1* 11/2016 Kim ...................... G06F 1/1681
2016/0381014 A1* 12/2016 Kim ...................... G06F 1/1652 726/7
2017/0003793 A1* 1/2017 Gao ...................... G06F 1/1681
2017/0064845 A1* 3/2017 Jung ................. G02F 1/133305
2018/0110139 A1* 4/2018 Seo ........................... E05D 1/04
2018/0375975 A1* 12/2018 Kikuchi ................ G06F 1/1686
2020/0051881 A1* 2/2020 Park ..................... H10D 86/411
2020/0393931 A1* 12/2020 Lee ....................... G06F 3/0412
2022/0011816 A1* 1/2022 Lee ....................... G06F 1/1652
2022/0043480 A1* 2/2022 Seo ....................... G06F 1/1616
2022/0199922 A1 6/2022 Choi et al.
2022/0209145 A1 6/2022 Kim et al.
2022/0294886 A1* 9/2022 Seo ....................... G06F 1/1641
2023/0015303 A1* 1/2023 Ryu .................... H04M 1/0214
2023/0200204 A1* 6/2023 Lee ...................... H10K 85/221 257/72
2023/0335020 A1* 10/2023 Chun ........................ B32B 3/30
2024/0224776 A1* 7/2024 Chang ................ H10K 59/8792
2025/0044889 A1* 2/2025 Jung ..................... G06F 3/0412

FOREIGN PATENT DOCUMENTS

KR 10-2022-0090038 A 6/2022
KR 10-2022-0095572 A 7/2022
KR 10-2471237 B1 11/2022

* cited by examiner

FIG. 9

| | P1 | P2 | PP |
|---|---|---|---|
| CASE1 | PT1 | PT1 | PT1 |
| CASE2 | PT1 | PT1 | PT2 |
| CASE3 | PT1 | PT1 | SM |
| CASE4 | PT1 | PT2 | PT1 |
| CASE5 | PT1 | PT2 | PT2 |
| CASE6 | PT1 | PT2 | SM |

FOLDABLE DISPLAY DEVICE WITH SUPPORT PLATE

CROSS-REFERENCE TO RELATED APPLICATION

This application claims priority under 35 U.S.C. § 119 to Korean Patent Application No. 10-2023-0128614, filed on Sep. 25, 2023, the content of which is herein incorporated by reference in its entirety.

TECHNICAL FIELD

The present disclosure relates to a display device. More specifically, the disclosure relates to a foldable display device.

DISCUSSION OF THE RELATED ART

A display device is a device configured to display moving and/or still images. Display devices are increasingly being produced to have a larger screen size while having a smaller overall form factor, such as having a smaller volume and/or thickness. Many display devices are also designed to be flexible/foldable/bendable, etc., which is to say, these display devices may be flexed, folded, bent, rolled, etc. to a noticeable degree without cracking or otherwise sustaining damage. Such devices may be folded or rolled so as to have a smaller form factor when not in use and then may be unfolded or unrolled so as to have a larger display while in use.

Folding display devices may be configured to fold inwardly so that the screen is protected while not in use. Folding display devices may alternatively, or additionally, be configured to fold outwardly so that the display remains visible even while folded.

SUMMARY

A display device includes a first plate, a second plate disposed on the first plate, and a display module disposed on the second plate. The display module includes a first non-folding area, a second non-folding area, a first folding area disposed between the first non-folding area and the second non-folding area, and a second folding area disposed between the first non-folding area and the second non-folding area. The first folding area is configured to fold so as to bring the first non-folding area and the second non-folding area to face one another in a first use form. The second folding area is configured to fold so as to bring the first non-folding area and the second non-folding area to face away one another in a second use form.

The first folding area may be folded inwardly in the first use form, and the second folding area may be folded outwardly in the second use form.

The first folding area may directly contact the second non-folding area, and the second folding area may directly contact the first non-folding area.

The display device may further include a display area where an image is displayed. Only a portion of the display area overlapping the first non-folding area may be exposed in the first use form.

The display device may further include a display area where an image is displayed. The display area may be entirely exposed in the second use form.

The first folding area may be configured to fold about a first folding axis extending in a second direction. The second folding area may be configured to fold about a second folding axis extending in the second direction. A width of the display device in a first direction, crossing the second direction, in the first use form may be different from a width of the display device in the first direction in the second use form.

A first portion of the second plate overlapping the first folding area may include openings arranged in a lattice shape.

Each of the openings may extend in the second direction.

A second portion of the second plate overlapping the second folding area may include openings arranged in a lattice shape.

A second portion of the second plate overlapping the second folding area may include patterns that are spaced apart from each other.

The patterns may extend in the second direction.

A portion of the first plate overlapping the second folding area may include openings arranged in a lattice shape.

A portion of the first plate overlapping the second folding area may include patterns spaced apart from each other.

A portion of the first plate overlapping the second folding area may include polyurethane and/or silicon.

The display device may further include a single-sided adhesive portion adhered to the first plate in the first folding area.

The display device may further include a double-sided adhesive portion adhered to the first plate and the second plate in the second folding area.

The display device may further include a camera. The camera may be exposed in the first use form and the second use form.

A display device includes a first plate, a second plate disposed on the first plate, and a display module disposed on the second plate, and including a first non-folding area, a second non-folding area, a first folding area disposed between the first non-folding area and the second non-folding area, and a second folding area disposed between the first non-folding area the second non-folding area. A first portion of the second plate overlapping the first folding area has a first pattern, and a second portion of the second plate overlapping the second folding area has a second pattern different from the first pattern.

The first folding area may be configured to fold so as to bring the first non-folding area and the second non-folding area to face one another in the first use form, and the second folding area may be configured to fold so as to bring the first non-folding area and the second non-folding area to face away from one another in the second use form.

The second non-folding area may be folded inwardly in the first use form, and may be folded outwardly in the second use form.

BRIEF DESCRIPTION OF THE DRAWINGS

The above and other features of the disclosure will become more apparent by describing in further detail embodiments thereof with reference to the accompanying drawings, in which:

FIG. 9 is a table illustrating a pattern or a material of a first plate and a second plate of the display device of FIG. 1.

DETAILED DESCRIPTION OF THE EMBODIMENT

Figure 1:
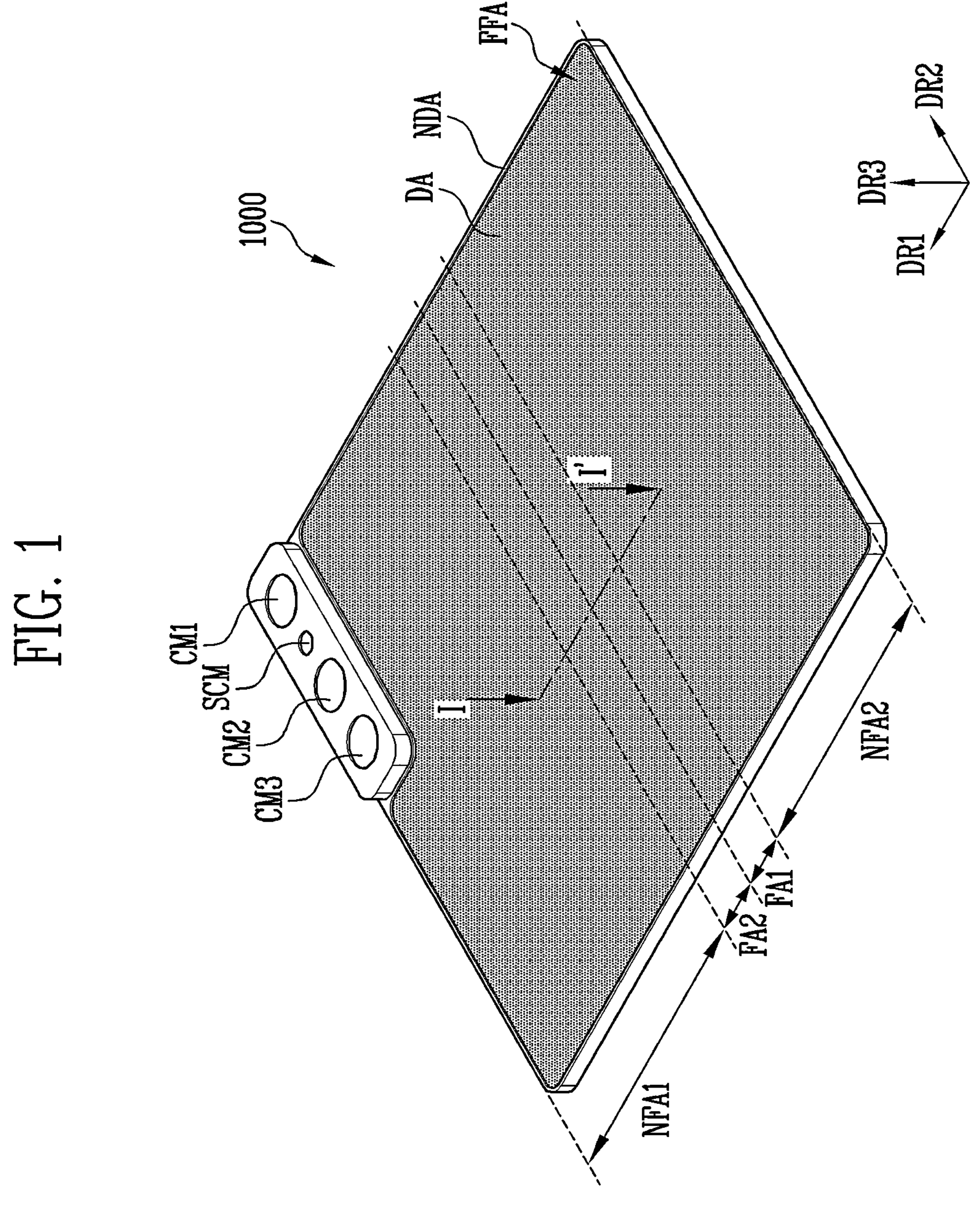
FIG. 1 is a diagram illustrating a display device according to embodiments of the disclosure.

Hereinafter, embodiments of the disclosure are described in detail with reference to the accompanying drawings. It should be noted that in the following description, while some portions of the embodiments are shown and described, descriptions of other portions may be omitted so as not to obscure the subject matter of the disclosure. In addition, the disclosure may be embodied in other forms without necessarily being limited to the embodiment described herein. However, the embodiment described herein is provided to describe in sufficient detail to implement the technical spirit of the disclosure to those skilled in the art to which the disclosure belongs.

Throughout the specification, in a case where a portion is “connected” to another portion, the case includes not only a case where the portion is “directly connected” but also a case where the portion is “indirectly connected” with another element interposed therebetween. Terms used herein are for describing specific embodiments and are not necessarily intended to limit the disclosure. Throughout the specification, in a case where a certain portion “includes”, the case means that the portion may further include another component without excluding another component unless otherwise stated. Here, “and/or” includes all combinations of one or more of corresponding configurations.

Here, terms such as first and second may be used to describe various components, but these components are not necessarily limited to these terms. These terms may be used to distinguish one component from another component. Therefore, a first component may refer to a second component within a range without departing from the scope disclosed herein.

Spatially relative terms such as “under”, “on”, and the like may be used for descriptive purposes, thereby describing a relationship between one element or feature and another element(s) or feature(s) as shown in the drawings. Spatially relative terms are intended to include other directions in use, in operation, and/or in manufacturing, in addition to the direction depicted in the drawings. For example, when a device shown in the drawing is turned upside down, elements depicted as being positioned “under” other elements or features are positioned in a direction “on” the other elements or features. Therefore, in an embodiment, the term “under” may include both directions of on and under. In addition, the device may face in other directions (for example, rotated 90 degrees or in other directions) and thus the spatially relative terms used herein are interpreted according thereto.

While each drawing may represent one or more particular embodiments of the present disclosure, drawn to scale, such that the relative lengths, thicknesses, and angles can be inferred therefrom, it is to be understood that the present invention is not necessarily limited to the relative lengths, thicknesses, and angles shown. Changes to these values may be made within the spirit and scope of the present disclosure, for example, to allow for manufacturing limitations and the like.

FIG. 1 is a diagram illustrating a display device according to embodiments of the disclosure.

Referring to FIG. 1, the display device 1000 may be a foldable display device. In the present specification, foldable may refer to a flexible state, and may include display devices that are bendable, rollable, and the like. Furthermore, foldable should be interpreted as being either partially foldable or fully foldable and may mean that the element may be folded outwardly or folded inwardly.

The display device 1000 may include an in-foldable display device (i.e., a display device that may be folded inwardly) and an out-foldable display device (i.e., a display device that may be folded outwardly). For example, the display device 1000 may be a display device capable of an in-folding use form and an out-folding use form. Here, the in-folding use form may mean a use form in which display areas DA are folded to face each other (refer to FIG. 3). In addition, the out-folding use form may mean a use form in which the display area DA of the display device 1000 is folded so that the display area DA faces outwardly (so that rear surfaces BA of FIG. 3, which are opposite surfaces of a front surface FFA, face each other) (refer to FIG. 5).

Hereinafter, for convenience of description, the in-folding use form is referred to as a first use form, and the out-folding use form is referred to as a second use form.

Figure 2:
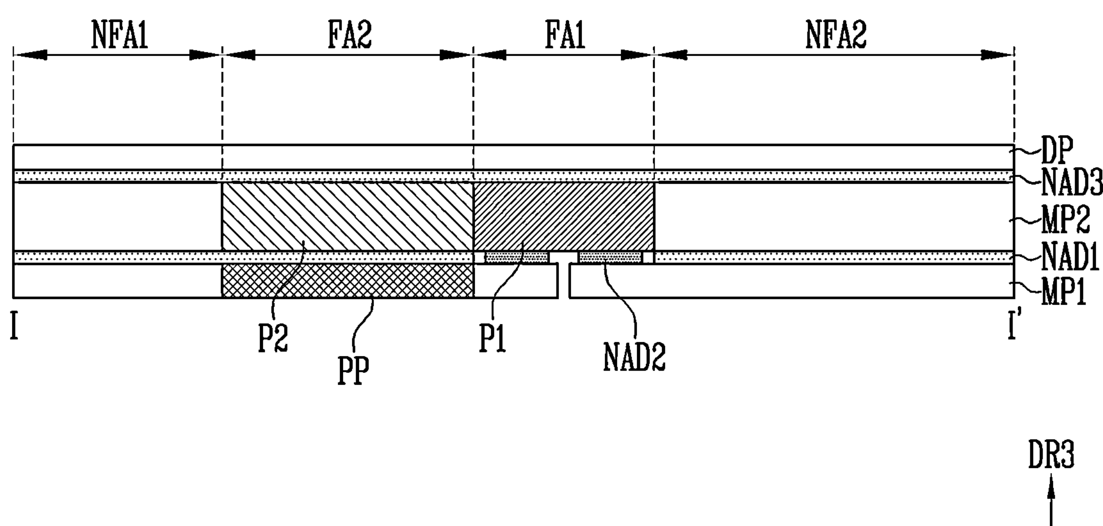
FIG. 2 is a cross-sectional view taken along a line I-I' of FIG. 1.

The display device 1000 may include a display module DP of FIG. 2 that displays an image. The display module DP of FIG. 2 may include a display area DA where an image is displayed and a non-display area NDA at least partially surrounding the display area DA. The display area DA may display an image in a third direction DR3 through the front surface FFA of the display device 1000.

The display module DP of FIG. 2 may include a first non-folding area NFA1, a second non-folding area NFA2, a first folding area FA1, and a second folding area FA2. The display device 1000 may be a foldable display device capable of being alternately arranged in the first use form and the second use form. The first use form may be folded along the first folding area FA1. The second use form may be folded along the second folding area FA2. A detailed explanation of this is provided later.

The first folding area FA1 and the second folding area FA2 may each extend primarily along a second direction DR2. The first folding area FA1 and the second folding area FA2 may both be disposed between the first non-folding area NFA1 and the second non-folding area NFA2 and may be proximate to each other.

For example, the first folding area FA1 may be adjacent to the second non-folding area NFA2, and the second folding area FA2 may be adjacent to the first non-folding area NFA1 (when in an unfolded state). For example, the first folding area FA1 may be adjacent to the second non-folding area NFA2 in a first direction DR1, the second folding area FA2 may be adjacent to the first folding area FA1 in the first direction DR1, and the first non-folding area NFA1 may be adjacent to the second folding area FA2 in the first direction DR1 (in the unfolded state).

In an embodiment, the display device 1000 may further include cameras CM1 to CM3. In an embodiment, the display device 1000 may include a first camera CM1, a second camera CM2, and a third camera CM3. For example, the first camera CM1 may be an ultra-wide-angle camera, the second camera CM2 may be a wide-angle camera, and the third camera CM3 may be a telephoto camera. However, the disclosure is not necessarily limited to the number and type of cameras CM1 to CM3 described herein.

In an embodiment, the display device 1000 may further include a camera auxiliary unit SCM for assisting imaging of the cameras CM1 to CM3. For example, the camera auxiliary unit SCM may be a light-emitting diode (LED) light or a light sensor.

FIG. 2 is a cross-sectional view taken along a line I-I' of FIG. 1.

Referring to FIGS. 1 and 2, the display device 1000 may include a first plate MP1, a second plate MP2, and the display module DP.

The display module DP may have a shape similar to that of the display device 1000 described above. The display module DP may include a display panel. An organic light emitting diode (OLED) display panel, a liquid crystal display (LCD) panel, a plasma display panel, an electrophoretic display panel, an electrowetting display panel, a quantum dot light emitting display panel, a micro LED display panel, a nano LED display panel, or the like may be applied as the display panel.

The display panel may include a flexible substrate including a flexible polymer material such as polyimide (PI). Accordingly, the display panel may be flexible, bent, folded, or rolled. The display panel may include a plurality of pixels. The plurality of pixels of the display panel may be positioned in a central portion (for example, the display area DA) of the display panel. Furthermore, the display panel may further include a signal line or driving circuits applying a signal to the pixel. At least a portion of the signal line and driving circuits may be positioned in an outside (for example, the non-display area NDA) of the display panel.

The pixel may include a light emitting layer and a circuit layer that controls an amount of light emitted from the light emitting layer. The circuit layer may include a plurality of lines, a plurality of electrodes, and at least one transistor. In an embodiment, the light emitting layer may include an organic light emitting material. The light emitting layer may be sealed by an encapsulation layer. The encapsulation layer may seal the light emitting layer and may prevent moisture or the like from entering from the outside. The encapsulation layer may be a single or multiple layers of an inorganic layer, but may be formed of a stack layer in which an inorganic layer and an organic layer are alternately stacked.

A window that protects the display module DP may be further disposed on the display module DP. The window may overlap the display panel in a thickness direction. The window may have substantially the same size as the display panel in a plan view.

The window may be formed of glass, quartz, or the like. A thickness of the window may be less than 100 μm. In some embodiments, the window may include ultra-thin chemically strengthened glass (ultra-thin glass (UTG). In some embodiments, the window may include a flexible material.

The display device 1000 may further include first and second plates MP1 and MP2 disposed under the display module DP.

The first and second plates MP1 and MP2 may prevent the display module DP from being bent due to external force or may alleviate a degree of bending (for example, a bending angle or a bending radius of curvature). For example, the first and second plates MP1 and MP2 may maintain the display module DP in a relatively flat state even though external force is applied.

The first and second plates MP1 and MP2 may include a rigid or semi-rigid material. For example, the first and second plates MP1, MP2 may include a metal material such as stainless steel (SUS) or aluminum, or polymer such as polymethyl methacrylate (PMMA), polycarbonate (PC), polyvinylalcohol (PVA), acrylonitrile-butadiene-styrene (ABS), and polyethylene terephthalate (PET).

However, a portion PP of the first plate MP1 may be formed of another material. A detailed description of this is provided later.

The second plate MP2 may be disposed on the first plate MP1. The display device 1000 may include a double-sided adhesive portion NAD1 adhered to the first plate MP1 and the second plate MP2. For example, the second plate MP2 may be adhered to the first plate MP1 through the double-sided adhesive portion NAD1.

For example, the double-sided adhesive portion NAD1 may be adhered to the first plate MP1 and the second plate MP2. For example, the double-sided adhesive portion NAD1 may be adhered to the first plate MP1 and the second plate MP2 in the first non-folding area NFA1, the second non-folding area NFA2, and the second folding area FA2.

The display device 1000 may further include a single-sided adhesive portion NAD2 adhered to the first plate MP1. For example, the single-sided adhesive portion NAD2 may be adhered to the first plate MP1 in the first folding area FA1.

The display module DP may be disposed on the second plate MP2. The display device 1000 may include a double-sided adhesive portion NAD3 adhered to the second plate MP2 and the display module DP. For example, the display module DP may be adhered to the second plate MP2 through the double-sided adhesive portion NAD3.

Figure 3:
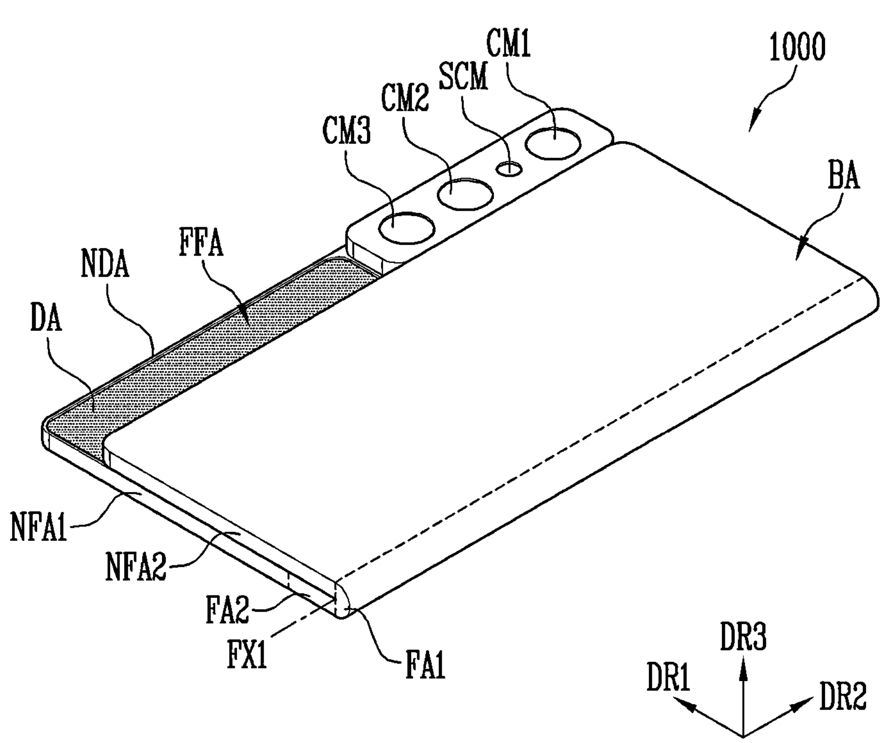
FIG. 3 is a diagram illustrating a first use form of the display device of FIG. 1.
Figure 4:
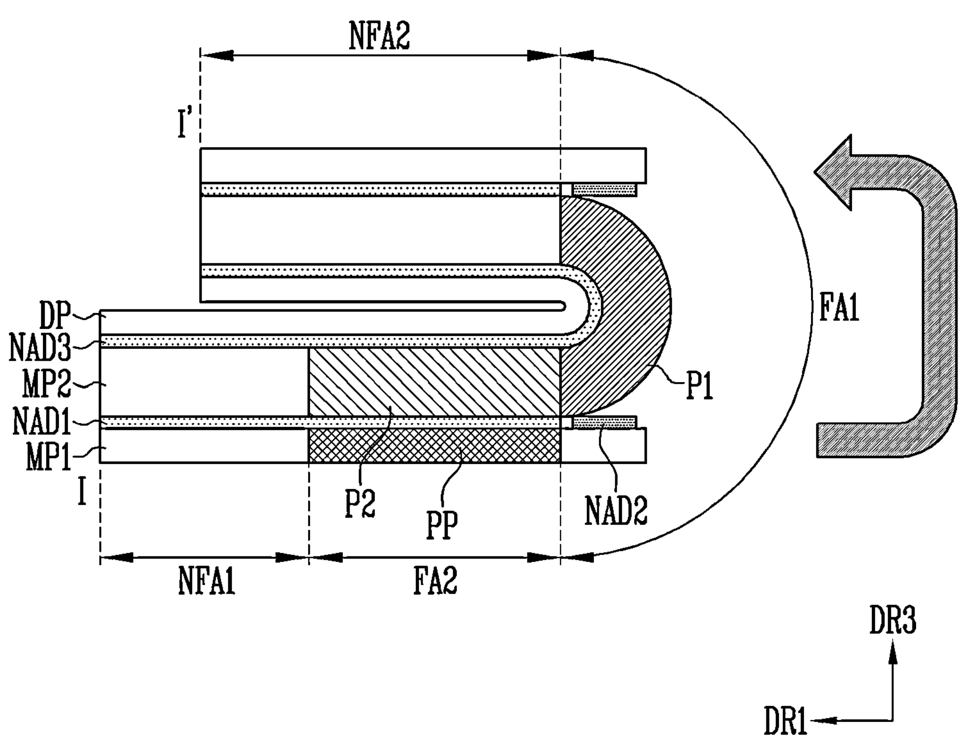
FIG. 4 is a cross-sectional view illustrating a change of the cross-sectional view of FIG. 2 in the first use form.

FIG. 3 is a diagram illustrating the first use form of the display device of FIG. 1, and FIG. 4 is a cross-sectional view illustrating a change of the cross-sectional view of FIG. 2 in the first use form.

Referring to FIG. 3, in the first use form, the first non-folding area NFA1 and the second non-folding area NFA2 may be folded to face each other about the first folding area FA1. For example, in the first use form, the second non-folding area NFA2 may be folded in the third direction DR3. For example, in the first use form, the rear surface BA of the display device 1000 may cover at least a portion of the front surface FFA.

In the first use form, the first non-folding area NFA1 and the second non-folding area NFA2 may be folded to face each other about a first folding axis FX1 extending in the second direction DR2.

In an embodiment, in the first use form, a portion overlapping the first non-folding area NFA1 of the display area DA may be exposed. For example, in the first use form, the second non-folding area NFA2 may cover a portion of the first non-folding area NFA1. Accordingly, a portion of the display area DA may be exposed, and the exposed display area DA may be variously utilized by displaying an image.

In an embodiment, the cameras CM1, CM2, and CM3 may be exposed in the first use form. For example, in the first use form, the second non-folding area NFA2 might not cover the cameras CM1, CM2, and CM3. Accordingly, the cameras CM1, CM2, and CM3 may be exposed, and the exposed cameras CM1, CM2, and CM3 may be utilized. For example, an auxiliary camera for the first use form might not be separately required.

Referring to FIGS. 3 and 4, the display device 1000 may be folded so that the first non-folding area NFA1 and the second non-folding area NFA2 face each other about the first folding axis FX1 extending in the second direction DR2. A first portion P1 overlapping the first folding area FA1 of the second plate MP2 may be bent, and thus the first non-folding area NFA1 and the second non-folding area NFA2 may face each other. The display module DP may be a flexible display module and thus may be easily bent.

The first plate MP1 may include a first portion and a second portion spaced apart from each other in an area overlapping the first folding area FA1. Since the first plate MP1 includes the first portion and the second portion spaced apart from each other, and the single-sided adhesive portion NAD2 is not adhered to the second plate MP2, the first non-folding area NFA1 and the second non-folding area NFA2 may be folded to face each other in the first use form.

In addition, in the first use form, the single-sided adhesive portion NAD2 may prevent the first portion P1 of the second plate MP2 from sagging in the third direction DR3 or a direction opposite to the third direction DR3.

Figure 5:
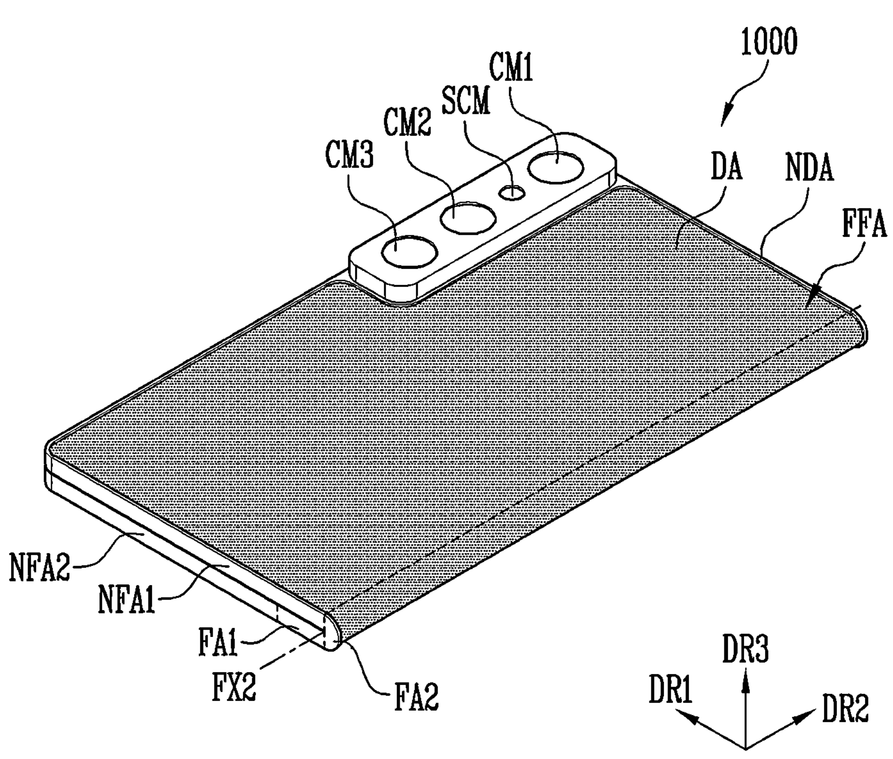
FIG. 5 is a diagram illustrating a second use form of the display device of FIG. 1.
Figure 6:
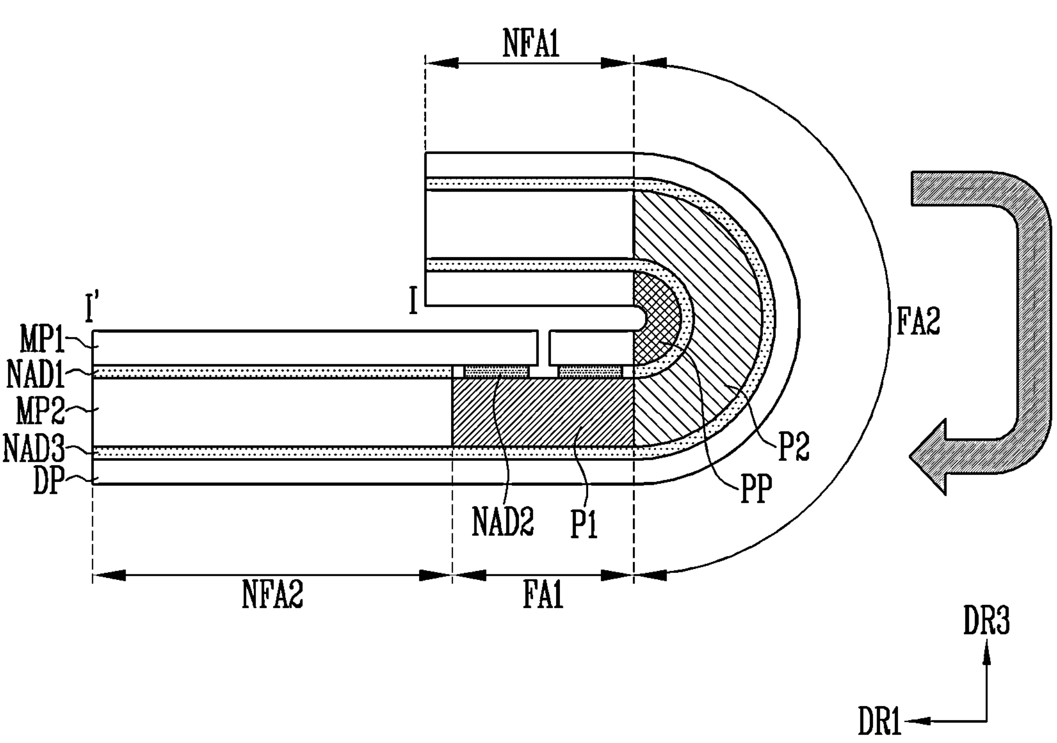
FIG. 6 is a cross-sectional view illustrating a change of the cross-sectional view of FIG. 2 in the second use form.

FIG. 5 is a diagram illustrating the second use form of the display device of FIG. 1, and FIG. 6 is a cross-sectional view illustrating a change of the cross-sectional view of FIG. 2 in the second use form.

Referring to FIG. 5, in the second use form, the first non-folding area NFA1 and the second non-folding area NFA2 may be folded to face each other about the second folding area FA2. For example, in the second use form, the second non-folding area NFA2 may be folded in the direction opposite to the third direction DR3. For example, in the second use form, the rear surfaces of the display device 1000 may be folded to face each other such that an entirety of the display area remains in view.

In the second use form, the first non-folding area NFA1 and the second non-folding area NFA2 may be folded to face each other about a second folding axis FX2 extending in the second direction DR2.

In an embodiment, in the second use form, the display area DA may be exposed. For example, in the second use form, the display area DA may be exposed in both of the third direction DR3 and in the direction opposite to the third direction DR3.

In an embodiment, the cameras CM1, CM2, and CM3 may be exposed in the second use form. For example, an auxiliary camera for the second use form might not be separated required.

Referring to FIGS. 5 and 6, in the display device 1000, the first non-folding area NFA1 and the second non-folding area NFA2 may be folded about the second folding axis FX2 extending in the second direction DR2 to face each other. A portion PP overlapping the second folding area FA2 of the first plate MP1 and a second portion P2 overlapping the second folding area FA2 of the second plate MP2 may be bent, and thus the first non-folding area NFA1 and the second non-folding area NFA2 may face each other. The display module DP may be a flexible display module and thus may be easily bent.

Referring to FIGS. 3 to 6, since the first folding axis FX1 and the second folding axis FX2 are different from each other, a width of the first direction DR1 crossing the second direction DR2 of the display device 1000 in the first use form and the width of the first direction DR1 of the display device 1000 in the second use form may be different from each other.

The display device 1000 may divide the first folding axis FX1 and the second folding axis FX2, and thus may minimize a wasted space such as a space where the display area DA is excessively exposed in the first use form or a space where the rear surface BA is exposed in the second use form.

Figure 7:
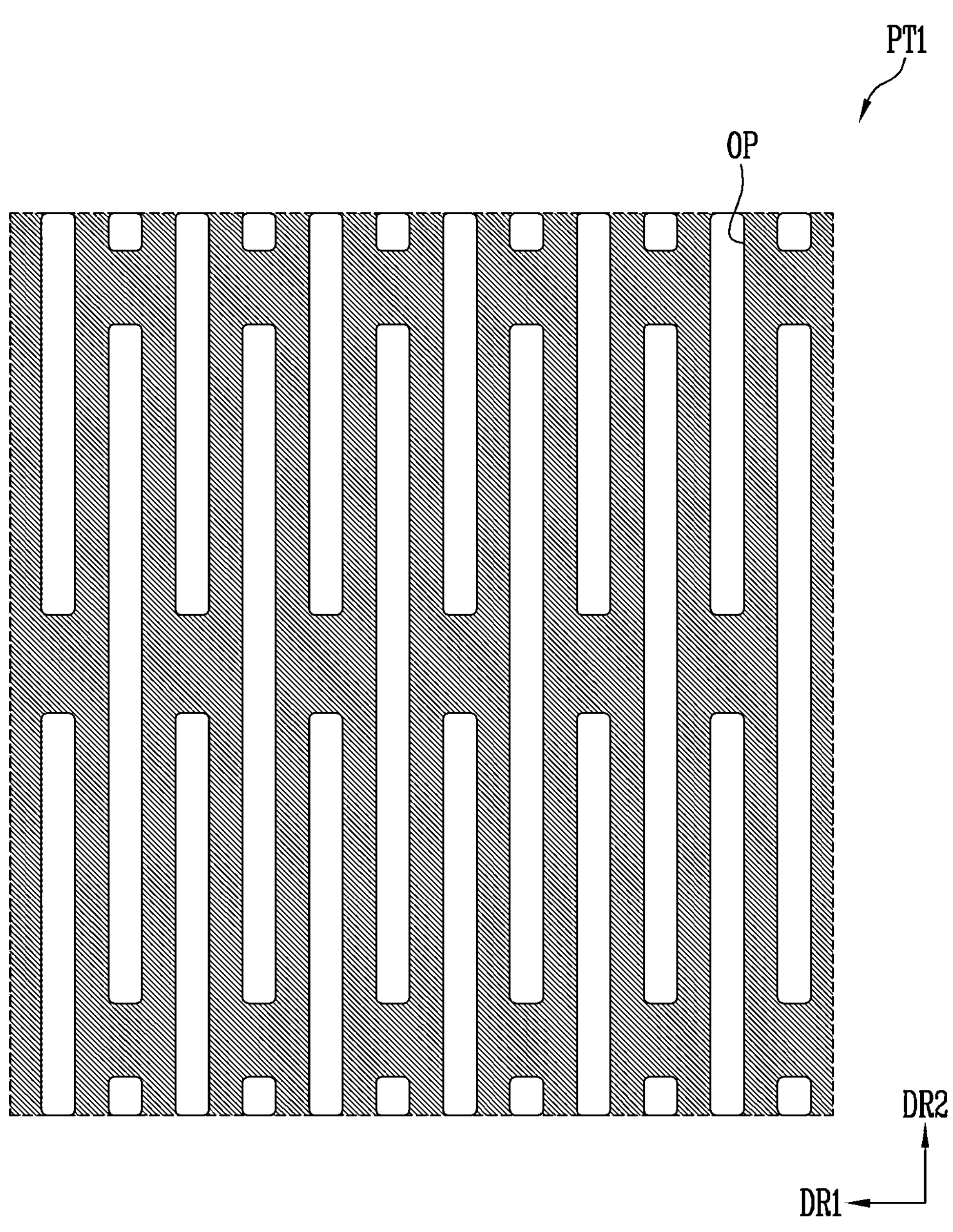
FIG. 7 is a diagram illustrating a first pattern.
Figure 8:
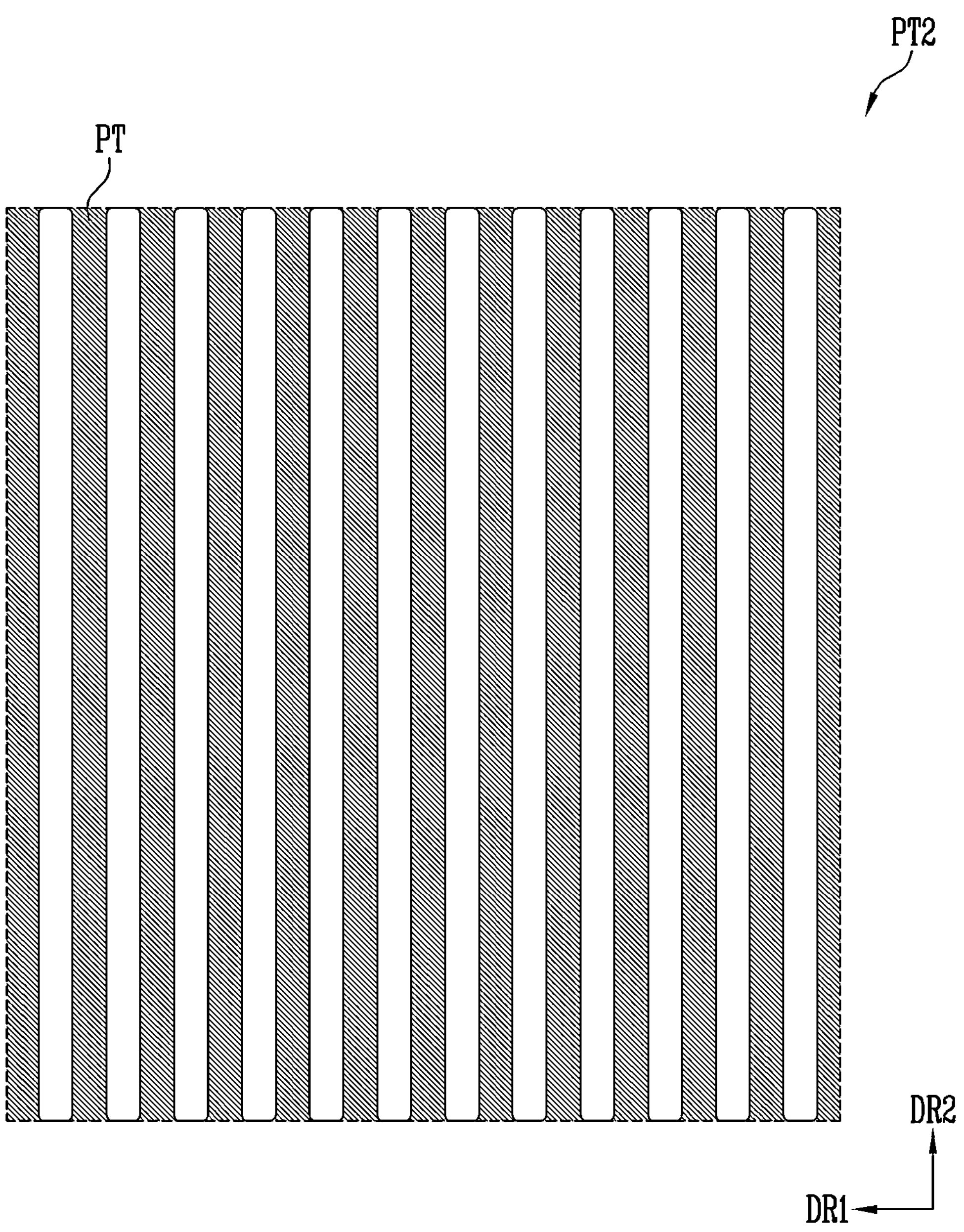
FIG. 8 is a diagram illustrating a second pattern.

FIG. 7 is a diagram illustrating a first pattern, FIG. 8 is a diagram illustrating a second pattern, and FIG. 9 is a table illustrating a pattern or a material of the first plate and second plate of the display device of FIG. 1.

Referring to FIG. 7, the first pattern PT1 may include openings OP arranged in a lattice shape. The openings OP may extend primarily in the second direction DR2 (i.e., their longest side may extend in the second direction DR2). In addition, the openings OP may be arranged to cross each other. The plates MP1 and MP2 may be easily bent due to the openings OP. However, the disclosure is not necessarily limited by a shape of the openings OP.

Referring to FIG. 8, the second pattern PT2 may include patterns PT spaced apart from each other. For example, the second pattern PT2 may include stripe patterns (for example, PT). The plates MP1 and MP2 may be easily compressed due to the patterns PT being spaced apart from each other. However, the disclosure is not necessarily limited by a shape of the patterns PT.

Referring to FIGS. 2 and 9, in a first case CASE1, the first portion P1 of the second plate MP2 may have the first pattern PT1, the second portion of the second plate MP2 P2 may have the first pattern PT1, and the portion PP of the first plate MP1 may have the first pattern PT1. Accordingly, the first plate MP1 and the second plate MP2 may be easily bent in the first folding area FA1 and the second folding area FA2.

In a second case CASE2, the first portion P1 of the second plate MP2 may have the first pattern PT1, the second portion P2 of the second plate MP2 may have the first pattern PT1, and the portion PP of the first plate MP1 may have the second pattern PT2. Accordingly, the first plate MP1 and the second plate MP2 may be easily bent in the first folding area FA1 and the second folding area FA2.

In a third case CASE3, the first portion P1 of the second plate MP2 may have the first pattern PT1, the second portion P2 of the second plate MP2 may have the first pattern PT1, and the portion PP of the first plate MP1 may include a soft material SM. For example, the portion PP of the first plate MP1 may include a material having a low modulus of elasticity, such as, for example, a modulus of elasticity less than 10 GPa, or preferably a modulus of elasticity less than 2 GPa. For example, the portion PP of the first plate MP1 may include polyurethane and/or silicon. Accordingly, the first plate MP1 and the second plate MP2 may be easily bent in the first folding area FA1 and the second folding area FA2.

The second portion P2 of the second plate MP2 may be raised in the third direction DR3 of FIG. 2 by being stretched in an out-folding state. Since the portion PP of the first plate disposed in the direction opposite to the third direction DR3 of FIG. 2 of the second portion P2 of the second plate MP2 includes the soft material, the portion P2 of the second plate MP2 may be sagged in the direction opposite to the third direction DR3 of FIG. 2, and the rise may be compensated.

In a fourth case CASE4, the first portion P1 of the second plate MP2 may have the first pattern PT1, the second portion P2 of the second plate MP2 may have the second pattern PT2, and the portion PP of the first plate MP1 may have the first pattern PT1. Accordingly, the first plate MP1 and the second plate MP2 may be easily bent in the first folding area FA1 and the second folding area FA2.

In a fifth case CASE5, the first portion P1 of the second plate MP2 may have the first pattern PT1, the second portion P2 of the second plate MP2 may have the second pattern PT2, and the portion PP of the first plate MP1 may have the second pattern PT2. Accordingly, the first plate MP1 and the second plate MP2 may be easily bent in the first folding area FA1 and the second folding area FA2.

In a sixth case CASE6, the first portion P1 of the second plate MP2 may have the first pattern PT1, the second portion P2 of the second plate MP2 may have the second pattern PT2, and the portion PP of the first plate MP1 may include the soft material SM. For example, the portion PP of the first plate MP1 may include a material having a low modulus. For example, the portion PP of the first plate MP1 may include at least one of polyurethane and silicon. Accordingly, the first plate MP1 and the second plate MP2 may be easily bent in the first folding area FA1 and the second folding area FA2.

The disclosure may be applied to a display device and an electronic device including the display device. For example, the disclosure may be applied to a digital television (TV), a three-dimensional (3D) TV, a mobile phone, a smart phone, a tablet computer, a virtual reality (VR)/augmented reality (AR) device, a personal computer (PC), a home electronic device, a notebook computer, a personal digital assistant (PDA), a personal media player (PMP), a digital camera, a digital music player, a portable game console, a navigation system, and the like.

Although embodiments have been described with reference to the figures, it will be understood that those skilled in the art can variously modify and change the disclosure without departing from the spirit and scope of the disclosure.

What is claimed is:

1. A display device, comprising:

a first plate;

a second plate disposed on the first plate; and a display module disposed on the second plate, the display module including a first non-folding area, a second non-folding area, a first folding area disposed between the first non-folding area and the second non-folding area, and a second folding area disposed between the first non-folding area and the second non-folding area, wherein the first folding area is configured to fold so as to bring the first non-folding area and the second non-folding area to face one another in a first use form, wherein the second folding area is configured to fold so as to bring the first non-folding area and the second non-folding area to face away one another in a second use form, wherein the first plate is divided into two portions that are spaced apart from one another within the first folding area, and wherein the first plate is formed of a first material in the first non-folding area, the second non-folding area, and the first folding area and is formed of a second material different from the first material in the second folding area.

2. The display device according to claim 1, wherein the first folding area is folded inwardly in the first use form, and the second folding area is folded outwardly in the second use form.

3. The display device according to claim 1, wherein the first folding area directly contacts the second non-folding area, and wherein the second folding area directly contacts the first non-folding area.

4. The display device according to claim 1, further comprising:

a display area where an image is displayed, wherein only a portion of the display area overlapping the first non-folding area is exposed in the first use form.

5. The display device according to claim 4, further comprising:

a display area where an image is displayed, wherein the display area is entirely exposed in the second use form.

6. The display device according to claim 1, wherein the first folding area is configured to fold about a first folding axis extending in a second direction, wherein the second folding area is configured to fold about a second folding axis extending in the second direction, and wherein a width of the display device in a first direction, crossing the second direction, in the first use form is different from a width of the display device in the first direction in the second use form.

7. The display device according to claim 1, wherein a first portion of the second plate overlapping the first folding area includes openings arranged in a lattice shape.

8. The display device according to claim 7, wherein the first folding area is configured to fold about a first folding axis extending in a second direction, wherein the second folding area is configured to fold about a second folding axis extending in the second direction, and wherein each of the openings extend in the second direction.

9. The display device according to claim 1, wherein a second portion of the second plate overlapping the second folding area includes openings arranged in a lattice shape.

10. The display device according to claim 1, wherein a second portion of the second plate overlapping the second folding area includes patterns that are spaced apart from each other.

11. The display device according to claim 10, wherein the first folding area is configured to fold about a first folding axis extending in a second direction, wherein the second folding area is configured to fold about a second folding axis extending in the second direction, and wherein the patterns extend in the second direction.

12. The display device according to claim 1, wherein a portion of the first plate overlapping the second folding area includes openings arranged in a lattice shape.

13. The display device according to claim 1, wherein a portion of the first plate overlapping the second folding area includes patterns spaced apart from each other.

14. The display device according to claim 1, wherein a portion of the first plate overlapping the second folding area includes polyurethane and/or silicon.

15. The display device according to claim 1, further comprising:

a single-sided adhesive portion adhered to the first plate in the first folding area.

16. The display device according to claim 1, further comprising:

a double-sided adhesive portion adhered to the first plate and the second plate in the second folding area.

17. The display device according to claim 1, further comprising:

a camera, wherein the camera is exposed in the first use form and the second use form.

18. An electronic device including a display device, the display device comprising:

a first plate;

a second plate disposed on the first plate; and a display module disposed on the second plate, and including a first non-folding area, a second non-folding area, a first folding area disposed between the first non-folding area and the second non-folding area, and a second folding area disposed between the first non-folding area the second non-folding area, wherein a first portion of the second plate overlapping the first folding area has a first pattern, wherein a second portion of the second plate overlapping the second folding area has a second pattern different from the first pattern, wherein the first plate is divided into two portions that are spaced apart from one another within the first folding area, and wherein the first plate is formed of a first material in the first non-folding area, the second non-folding area, and the first folding area and is formed of a second material different from the first material in the second folding area.

19. The electronic device according to claim 18, wherein the first folding area is configured to fold so as to bring the first non-folding area and the second non-folding area to face one another in the first use form, and the second folding area is configured to fold so as to bring the first non-folding area and the second non-folding area to face away from one another in the second use form.

20. The electronic device according to claim 19, wherein the second non-folding area is folded inwardly in the first use form, and is folded outwardly in the second use form.

* * * * *